United States Patent
Horimai et al.

(10) Patent No.: US 10,355,156 B2
(45) Date of Patent: Jul. 16, 2019

(54) LIGHT-CONCENTRATING MECHANISM, PHOTOVOLTAIC POWER GENERATION DEVICE, WINDOW STRUCTURE, AND WINDOW GLASS

(71) Applicants: Holomedia, LLC, Numazu-shi, Shizuoka (JP); Egarim Corporation Japan, Shizuoka-shi, Shizuoka (JP)

(72) Inventors: Hideyoshi Horimai, Numazu (JP); Toshihiro Kasezawa, Shizuoka (JP); Chikara Kasezawa, Shizuoka (JP)

(73) Assignees: Holomedia, LLC, Numazu-shi (JP); Egarim Corporation Japan, Shizuoka-shi (JP)

(*) Notice: Subject to any disclaimer, the term of this patent is extended or adjusted under 35 U.S.C. 154(b) by 73 days.

(21) Appl. No.: 14/762,312

(22) PCT Filed: Jan. 20, 2014

(86) PCT No.: PCT/JP2014/050971
§ 371 (c)(1),
(2) Date: Oct. 19, 2015

(87) PCT Pub. No.: WO2014/112620
PCT Pub. Date: Jul. 24, 2014

(65) Prior Publication Data
US 2016/0087135 A1    Mar. 24, 2016

(30) Foreign Application Priority Data
Jan. 21, 2013 (JP) .................................. 2013-008745

(51) Int. Cl.
*G02B 5/08* (2006.01)
*G02B 5/26* (2006.01)
(Continued)

(52) U.S. Cl.
CPC ........ *H01L 31/0547* (2014.12); *E06B 3/6715* (2013.01); *E06B 7/28* (2013.01);
(Continued)

(58) Field of Classification Search
CPC .... G02B 6/0023; G02B 6/0028; Y02B 10/10; H01L 31/0547; Y02E 10/52
See application file for complete search history.

(56) References Cited

U.S. PATENT DOCUMENTS

| | | | | |
|---|---|---|---|---|
| 4,108,540 A | * | 8/1978 | Anderson | F24J 2/085 126/684 |
| 4,863,224 A | * | 9/1989 | Afian | G02B 5/32 136/246 |
| 2008/0271776 A1 | * | 11/2008 | Morgan | F21S 11/00 136/246 |

FOREIGN PATENT DOCUMENTS

JP    2012099681 A  *  5/2012
WO   WO 2010/033632     3/2010

OTHER PUBLICATIONS

Machine translation of JP 2012099681 A, Imaoka et al., retrieved from EPO on Apr. 4, 2016.*
(Continued)

*Primary Examiner* — Mayla Gonzalez Ramos
(74) *Attorney, Agent, or Firm* — William C. Schrot; AuerbachSchrot LLC

(57) ABSTRACT

[Problem] To provide a light-concentrating mechanism that is suitable for photovoltaic power generation. [Solution] This light-concentrating mechanism comprises an angle selective reflection means that reflects light having an incident angle of at least a first threshold angle and transmits at least some of the light having an incident angle smaller than the first threshold angle, and an angle-increase reflection means that reflects incident light at an angle greater than the incident angle of said light, the two means being arranged so (Continued)

as to have a gap therebetween. The angle-increase reflection means reflects, at an angle that is equal to or greater than the first threshold angle, at least some of the light that has been transmitted by the angle-selective reflection means, and the angle-selective reflection means reflects the light that has been reflected by the angle-increase reflection means and has an angle that is equal to or greater than the first threshold angle, and light is propagated and concentrated by the gap between the angle-selective reflection means and the angle-increase reflection means.

14 Claims, 7 Drawing Sheets

(51) Int. Cl.
*G02B 5/28* (2006.01)
*G02B 5/32* (2006.01)
*G02B 27/14* (2006.01)
*H01L 31/054* (2014.01)
*E06B 3/67* (2006.01)
*E06B 7/28* (2006.01)
*E06B 9/24* (2006.01)
*F24S 10/40* (2018.01)
*F24S 20/63* (2018.01)
*G02B 19/00* (2006.01)

(52) U.S. Cl.
CPC ............... *E06B 9/24* (2013.01); *F24S 10/40* (2018.05); *F24S 20/63* (2018.05); *G02B 5/0891* (2013.01); *G02B 5/26* (2013.01); *G02B 5/283* (2013.01); *G02B 5/32* (2013.01); *G02B 19/0023* (2013.01); *G02B 19/0042* (2013.01); *G02B 27/141* (2013.01); *G02B 27/142* (2013.01); *G02B 27/144* (2013.01); *E06B 2009/2476* (2013.01); *Y02B 10/22* (2013.01); *Y02E 10/44* (2013.01); *Y02E 10/52* (2013.01)

(56) References Cited

OTHER PUBLICATIONS

European Search Report EP 14740534.4 (PCT/JP2014/050971) (dated 2016) (7 pages).

\* cited by examiner

LIGHT-CONCENTRATING MECHANISM, PHOTOVOLTAIC POWER GENERATION DEVICE, WINDOW STRUCTURE, AND WINDOW GLASS

TECHNICAL FIELD

The present invention relates to a light-concentrating mechanism, and more particularly, to a light-concentrating mechanism for photovoltaic power generation, a photovoltaic power generation device which uses the light-concentrating mechanism, a window structure, and a functional glass window usable in the light-concentrating mechanism.

BACKGROUND ART

In recent years, photovoltaic power generation devices have been installed in buildings, various facilities, houses, and the like from the perspective of effective utilization of natural energy. Photovoltaic power generation devices are broadly classified into a non-concentration type in which sunlight is radiated directly to photovoltaic cells and a concentration type in which sunlight concentrated by light-concentrating means such as lenses is radiated to photovoltaic cells.

Specifically, a non-concentration-type photovoltaic power generation device which is incorporated into a window structure of a building frame has been proposed (for example, see Patent Literature 1). Patent Literature 1 discloses a window structure in which an outer glass and an openable inner glass are provided in a window frame that is fitted into an opening of the frame and in which a photovoltaic battery panel is detachably attached to a window frame.

Moreover, a concentration-type power generation glass window installed in a house is proposed (for example, see Patent Literature 2). The power generation glass window disclosed in Patent Literature 2 includes a transparent substrate, a light control film provided on an incidence surface of the transparent substrate, and a photovoltaic battery disposed at an end of the transparent substrate. The light control film scatters light incident at a predetermined angle only, and a portion of the scattered light propagate inside the substrate and is received by the photovoltaic battery disposed in the end D. On the other hand, when light is incident to the light control film at a specific angle different from the predetermined angle, scattering does not occur, but incident light passes through the light control film and the transparent substrate and exits from an exiting surface.

CITATION LIST

Patent Literature

Patent Literature 1: Japanese Patent Application Publication No. 2010-144375
Patent Literature 2: Japanese Patent Application Publication No. 2012-23089

SUMMARY OF INVENTION

Technical Problem in the window structure disclosed in Patent Literature 1, a transparent photovoltaic battery panel having an area corresponding to the area of a double-pane glass window is provided. However, since a greater part of incident light is received taken into a photoelectric conversion layer and the transmittance to the interior side decreases and the visibility of outside scenes may deteriorate. Further, the manufacturing cost of see-through-type photovoltaic batteries is high. Moreover, in general, since the energy density of sunlight radiated actually is far lower than the energy density that photovoltaic batteries can accommodate, the photovoltaic power generation device does not provide its maximum power generation capacity. As described above, a non-concentration-type photovoltaic power generation device cannot utilize the solar energy radiated to the window to its full extent.

On the other hand, the power generation glass window disclosed in Patent Literature 2 includes the light control film provided in one glass window and can concentrate the radiated light to some extent using the refractive indice of the respective layers of the window. Moreover, the glass window can secure a better light-transmitting property than the window structure disclosed in Patent Literature 1 and can use small photovoltaic cells. However, since only a portion of the light scattered by the light control film is used as the light guided to a photovoltaic battery module, the light concentration efficiency as a light-concentrating mechanism is low. Further, since the light control film or the photovoltaic battery module is exposed to the outside, the film or the module may be damaged by physical force, and the aging of the photovoltaic battery module may progress with a repeated change in humidity and temperature.

The present invention has been made in view of the above-described problems and an object thereof is to provide a light-concentrating mechanism capable of solving at least some of the problems, a photovoltaic power generation device which uses the light-concentrating mechanism, a window structure, or a functional glass window usable in the light-concentrating mechanism.

Solution to Problem

In order to solve the problems, a light-concentrating mechanism according to the present invention includes: an angle-selective reflector that reflects light having an incidence angle equal to or larger than a first threshold angle and transmits at least a portion of light having an incidence angle smaller than the threshold angle; and an angle-increasing reflector that reflects incident light at an angle larger than an incidence angle thereof, the reflectors being disposed with a gap therebetween, wherein the angle-increasing reflector reflects at least a portion of the light having passed through the angle-selective reflector at an angle equal to or larger than the first threshold angle, the angle-selective reflector reflects light having an angle equal to or larger than the first threshold angle, reflected by the angle-increasing reflector, and light is concentrated by causing the light to propagate in the gap between the angle-selective reflector and the angle-increasing reflector.

In the light-concentrating mechanism, it is preferable that the angle-selective reflector has an angle-increasing property so that light reflected from the angle-increasing reflector and incident to the angle-selective reflector is reflected at an angle larger than an incidence angle thereof. It is preferable that the angle-selective reflector has a refracting property so that light passing through the angle-selective reflector is refracted at an angle larger than an incidence angle thereof.

Moreover, it is preferable that the angle-increasing reflector has such an angle-selective property as to reflect light incident at an incidence angle equal to or larger than a second threshold angle and transmit light incident at an incidence angle smaller than the second threshold angle. It is also preferable that the angle-selective reflector or the angle-increasing reflector has such a deflecting property as to transmit or reflect light incident to the angle-selective reflector or the angle-increasing reflector while deflecting a traveling direction of the light. It is also preferable that the angle-selective reflector and the angle-increasing reflector have such a wavelength-selective property as to transmit light in a predetermined wavelength range.

Further, the angle-increasing reflector may include a flat holographic optical element, and the flat holographic optical element may reflect light from the angle-selective reflector at an angle larger than an incidence angle thereof. The angle-increasing reflector may include an inclined surface of a reflecting film, a dielectric multi-layer mirror, or a reflective holographic optical element, and the inclined surface may be provided so that incident light is reflected at an angle larger than an incidence angle thereof.

Further, in the light-concentrating mechanism, the angle-selective reflector may be provided on a front surface of glass and the angle-increasing reflector may be provided on a rear surface of the glass so that light is concentrated on an end of the glass by causing the light to propagate. The angle-selective reflector may be the front surface of the glass.

The angle-selective reflector may include a flat holographic optical element or dielectric multi-layer film, and the flat holographic optical element or dielectric multi-layer film may reflect light having an incidence angle equal to or larger than the first threshold angle and may transmit light having an incidence angle smaller than the first threshold angle. The angle-selective reflector may include an inclined surface of a dielectric multi-layer mirror or a reflective holographic optical element, and the inclined surface may be provided so that light from the angle-increasing reflector is reflected at an angle larger than an incidence angle thereof.

A photovoltaic power generation device according to the present invention includes any one of the light-concentrating mechanisms; and a photovoltaic cell that receives light concentrated by the light-concentrating mechanism to generate electricity.

A window structure having a light-concentrating mechanism according to the present invention includes: two pieces of glass disposed in parallel with a gap therebetween; an angle-selective reflector provided in one of the two pieces of glass so as to reflect light having an incidence angle equal to or larger than a predetermined threshold angle and transmit light having an incidence angle smaller than the predetermined threshold angle; and an angle-increasing reflector provided in the other one of the two pieces of glass so as to reflect light from the angle-selective reflector at an angle larger than an incidence angle thereof, wherein the angle-increasing reflector reflects at least a portion of the light having passed through the angle-selective reflector at an angle equal to or larger than the first threshold angle, the angle-selective reflector reflects light having an angle equal to or larger than the first threshold angle, reflected by the angle-increasing reflector, and light is concentrated by causing the light to propagate between the angle-selective reflector and the angle-increasing reflector.

In the window structure, the angle-selective reflector may be a flat holographic optical element or dielectric multi-layer film and may be bonded to or deposited on a side of one of the two pieces of glass close to the gap. Moreover, the angle-selective reflector may include an inclined surface of a dielectric multi-layer mirror or a reflective holographic optical element, and the inclined surface may be provided so that light from the angle-increasing reflector is reflected at an angle larger than an incidence angle thereof.

Moreover, the angle-increasing reflector may be a flat holographic optical element and may be bonded to or deposited on a side of the other one of the two pieces of glass close to the gap. The angle-increasing reflector may include an inclined surface of a reflecting film, a dielectric multi-layer mirror, or a reflective holographic optical element, and the inclined surface may be provided so that light from the angle-selective reflector is reflected at an angle larger than an incidence angle thereof.

It is preferable that the window structure includes a photovoltaic cell that receives light concentrated in a predetermined direction by the angle-increasing reflector and the angle-increasing reflector to generate electricity.

A functional glass window according to the present invention is a functional glass window in which a reflecting film, a dielectric multi-layer mirror, or a reflective holographic optical element having a plurality of inclined surfaces disposed repeatedly is enclosed and which has such an angle-increasing property as to reflect incident light at an angle larger than an incidence angle thereof.

In the functional glass window, it is preferable that a flat holographic optical element or a flat dielectric multi-layer film having such an angle-selective property as to reflect light having an incidence angle larger than a predetermined threshold angle and transmit light having an incidence angle smaller than the threshold angle is enclosed.

A method of manufacturing a functional glass window according to the present invention is a method of manufacturing a functional glass window having such an angle-increasing property as to reflect incident light at an angle larger than an incidence angle thereof, the method including: preparing a glass substrate having a surface shape in which a plurality of inclined surfaces having a predetermined inclination angle are disposed repeatedly; depositing a dielectric multi-layer film on the plurality of inclined surfaces formed in the glass substrate; and applying an optical adhesive to the deposited dielectric multi-layer film and attaching a flat glass to the glass substrate.

Advantageous Effects of Invention

According to the present invention, it is possible to realize a light-concentrating mechanism having a simple structure using an angle-selective reflector and an angle-increasing reflector. Moreover, it is possible to form a high-efficiency photovoltaic power generation device which uses the light-concentrating mechanism. Further, it is possible to provide a window structure having a high-efficiency light concentrating function by disposing the light-concentrating mechanism in the window structure. Further, it is possible to provide a functional glass window for a light-concentrating mechanism of the window structure. The other advantageous effects will be described in Description of Embodiments.

DESCRIPTION OF EMBODIMENTS

Hereinafter, embodiments of the present invention will be described with reference to the drawings. However, the present invention is not limited the following examples.

[Configuration of Light-Concentrating Mechanism]

Figure 1:
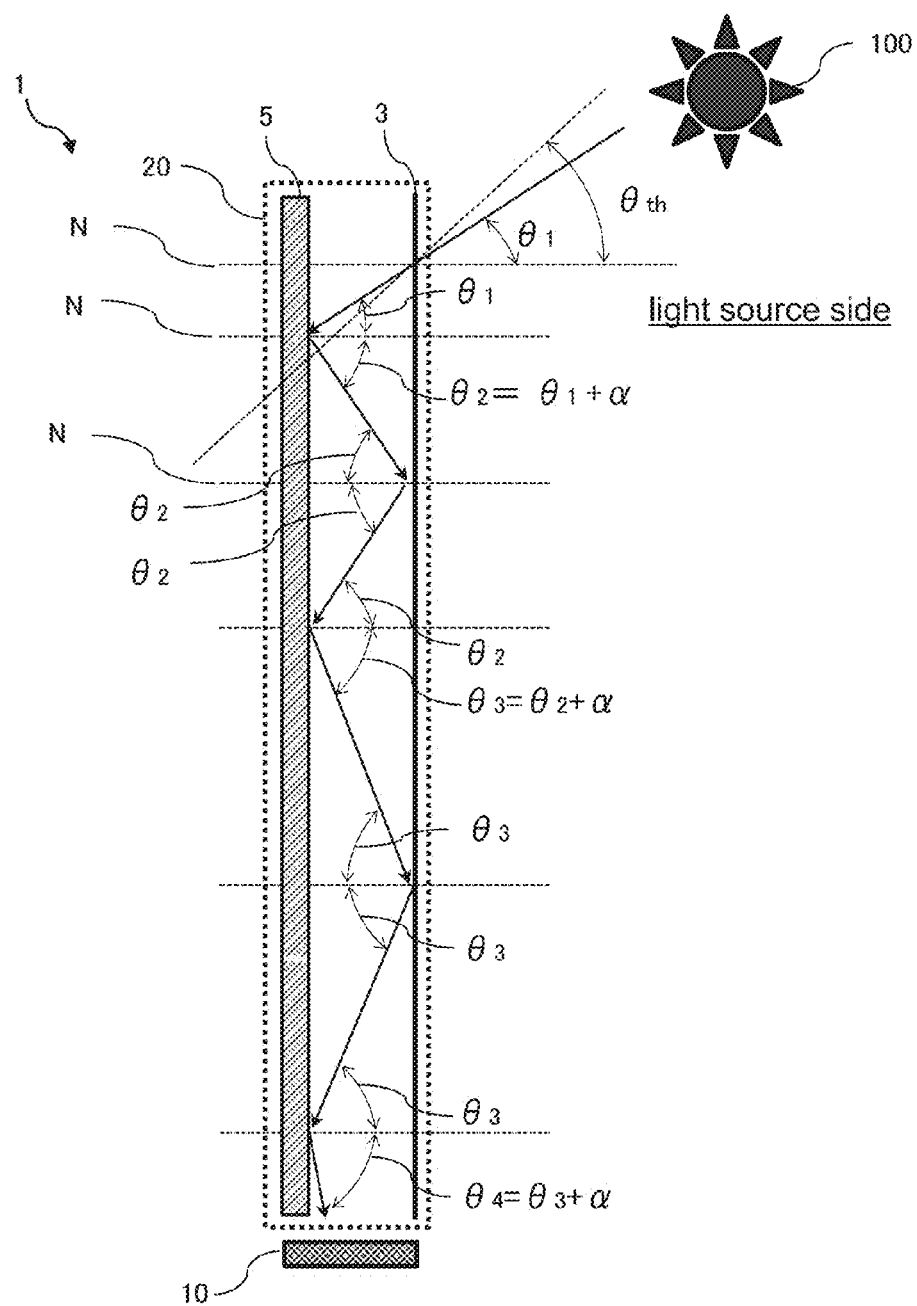
FIG. 1 is a diagram illustrating a schematic configuration of a light-concentrating mechanism according to the present invention.

FIG. 1 is a diagram illustrating a schematic configuration of a light-concentrating mechanism according to the present invention. A light-concentrating mechanism 20 of the present invention includes an angle-selective reflector 3 and an angle-increasing reflector 5, the two reflectors being disposed with a gap therebetween. The light-concentrating mechanism 20 of the present invention is a mechanism for concentrating light on an edge of the light-concentrating mechanism 20 by receiving light from a light source 100 on a front surface (a light-receiving surface) of the angle-selective reflector 3, confining at least a portion of the light having passed through the light-receiving surface of the angle-selective reflector 3 in the gap inside the mechanism, and causing light to propagate toward an edge in the gap. The light-concentrating mechanism 20 of the present invention can supply the concentrated light to a photoelectric converter (a photovoltaic cell 10) for photovoltaic power generation. However, the light-concentrating mechanism is not limited thereto. The light-concentrating mechanism 20 of the present invention may supply the concentrated light to means (for example, a heat pipe or the like) capable of converting light to heat energy or lighting means. Moreover, the light-concentrating mechanism can be also used as a light-guiding plate having a light-concentrating function.

In the present specification, a side close to the light source 100, of the light-concentrating mechanism 20 or a photovoltaic power generation device 1 or the like having the light-concentrating mechanism 20 will be referred to as a front side and the opposite side from the light source 100 will be referred to as a rear side. Moreover, in the present specification, a plane defined by a height and a width when the dimensions of the light-concentrating mechanism 20 are expressed as a height, a width, and a thickness is used as a reference plane, and angles described later such as a threshold angle $\theta_{th}$, an incident light or exiting light $\theta_n$ (n=1, 2, 3, 4, ...), an azimuth angle, an incremental angle $\alpha$, and an inclination angle $\beta$ are defined with respect to the normal N to the plane.

Figure 2:
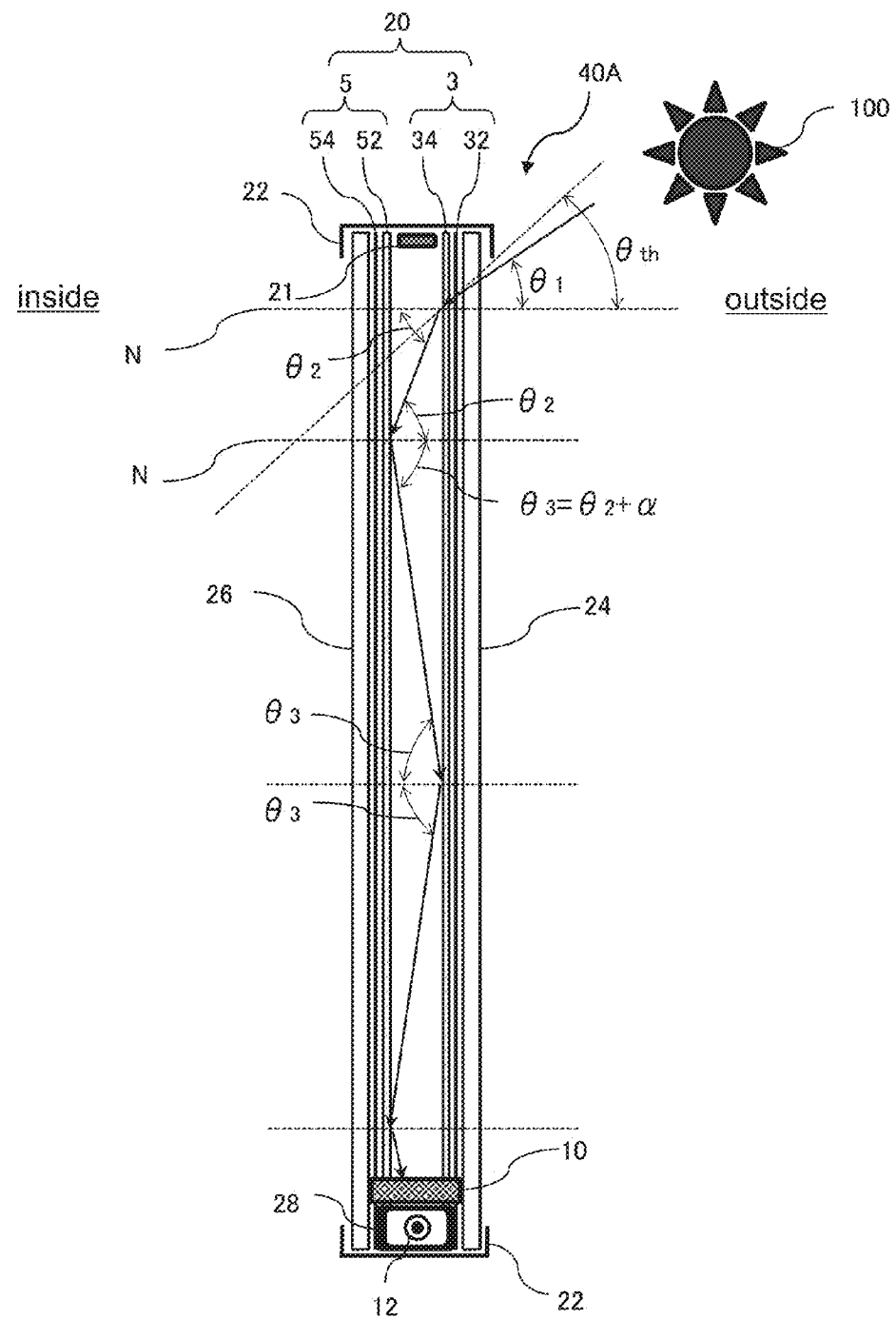
FIG. 2 is a diagram illustrating a schematic configuration of a double-pane window structure according to a first embodiment.

The light-concentrating mechanism 20 of the present invention is preferably disposed integrally with a window structure (see FIG. 2). Here, a window structure is incorporated into a surface in contact with the outside, of a house, a building, and various facilities as a window and is attached to a window portion of a vehicle (an automobile, a train, or the like) and includes an openable structure and a fixed structure. However, the window structure is not limited thereto. The light-concentrating mechanism 20 may be applied to a structure which does not aim ventilation and lighting, such as, for example, a portable partition or a partition wall. Moreover, the light-concentrating mechanism 20 can be applied to a wall material or a roof material of an architecture. Further, the light-concentrating mechanism 20 may be used as a general panel for photovoltaic power generation. The light-concentrating mechanism 20 may be disposed vertically to a wall and may be disposed obliquely or horizontally on a roof, a rooftop, the ground, or the like. Moreover, the light-concentrating mechanism 20 may be disposed in a room, a house, a commercial facility as well as a portion in contact with the outside of a house. In the light-concentrating mechanism 20 of the present invention, the angle-selective reflector 3 and the angle-increasing reflector 5 are preferably disposed approximately in parallel to each other, but the two reflectors are not necessarily parallel to each other. Although the light-concentrating mechanism 20 illustrated in FIG. 1 has the angle-selective reflector 3 and the angle-increasing reflector 5 which are planar and has a planar overall shape, each configurational elements may be deformed. For example, the angle-selective reflector 3 and the angle-increasing reflector 5 may be deformed in the same direction and be used as an arch-shaped roof material or a curved wall material. Any one of the angle-selective reflector 3 and the angle-increasing reflector 5 may be deformed, and the angle-selective reflector 3 and the angle-increasing reflector 5 may be deformed in opposite directions.

In FIG. 1, although the sun is illustrated as the light source 100, the present invention is not limited thereto, and light (for example, an illumination) other than the sunlight may be used. Moreover, although the amount of light radiation from the light source 100 is small, the light-concentrating mechanism 20 of the present invention can receive the light from the light source 100 on the light-receiving surface (the entire front surface of the angle-selective reflector 3) of the light-concentrating mechanism and efficiently concentrate light with the aid of the angle-selective reflector 3 and the angle-increasing reflector 5. Thus, the light-concentrating mechanism 20 may be disposed in a direction other than a south-east direction and a south-west direction and inside a house. In this case, light from the sun or the like may be guided by an optical fiber or a mirror.

The angle-selective reflector 3 has such an angle-selective property as to reflect light incident at an incidence angle equal to or larger than a first threshold angle $\theta_{th}$ (preferably, one within the range of 30° to 70°) and transmit light incident at an incidence angle $\theta_1$ smaller than the first threshold angle $\theta_{th}$. The angle-selective reflector 3 has a function of transmitting at least a portion of light from the light source 100 and causing light to enter the gap between the angle-selective reflector 3 and the angle-increasing reflector 5 and a function of reflecting at least a portion of the light from the angle-increasing reflector 5 so that light is confined in the gap. Thus, the angle-selective reflector 3 has an angle-selective property and is configured to transmit light incident from the light source 100 to the angle-selective reflector 3 at an incidence angle $\theta_1$ smaller than the first threshold angle $\theta_{th}$ and reflect light having an incidence angle equal to or larger than the first threshold angle $\theta_{th}$, within the light of which the incidence angle has been increased by the angle-increasing reflector 5 to thereby confine light in the gap. The angle-selective reflector 3 reflects the light from the angle-increasing reflector 5 as well as the light from the light source 100 if the incidence angle thereof is larger than the first threshold angle $\theta_{th}$ and transmits the light if the incidence angle thereof is smaller than the first threshold angle $\theta_{th}$. Thus, the angle-increasing reflector 5 can confine light of which the incidence angle to the angle-selective reflector 3 has become larger than the first threshold angle $\theta_{th}$.

The angle-selective reflector 3 may have at least one of a wavelength-selective property, a refracting property, an angle-increasing property, and a deflecting property in addition to the angle-selective property. When the angle-selective reflector 3 has a wavelength-selective property, it is possible to transmit or reflect light in a predetermined wavelength range only and to reflect or transmit light having the other wavelengths. For example, the light-concentrating mechanism can be used as a part of a window by transmitting light in a visible wavelength range and can reflect and concentrate light in the other wavelengths. When the angle-selective reflector 3 has a refracting property, it is possible to refract light passing therethrough. For example, when the angle-selective reflector 3 transmits light from a light source, the angle-selective reflector 3 refracts light incident at an angle $\theta_1$ at an angle larger than the angle $\theta_1$ (see FIG. 2). With this configuration, even when an incremental angle of the angle-increasing reflector 5 described later is set to be small, since an incidence angle of light reflected by the angle-increasing reflector 5 and incident to the angle-selective reflector 3 can easily exceed a predetermined first threshold angle $\theta_{th}$, it is possible to enhance light concentration efficiency. Moreover, when the angle-selective reflector 3 has an angle-increasing property, light incident from the angle-increasing reflector 5 to the angle-selective reflector 3 at an angle $\theta_2$ can be reflected at an angle larger than the angle $\theta_2$. Moreover, when the angle-selective reflector 3 has a deflecting property, it is possible to deflect light passing therethrough in a predetermined direction. For example, it is possible to transmit incident light of which the azimuth angle (the east, west, south, and north directions) is oblique by deflecting the azimuth angle in the normal direction and to transmit light having a small incidence angle (for example, light incident vertically) at a large angle to thereby enhance light concentration efficiency.

The function of the angle-selective reflector 3 can be realized by a hologram. A hologram is an image that records an interference pattern of two light components (in general referred to as object light and reference light), and when one light component is radiated to the hologram, the other light component can be reproduced by diffraction. Moreover, a refractive hologram (two light components are incident to the hologram from opposite surfaces) and a transmissive hologram (two light components are incident to the hologram from the same surface) can be realized depending on the directions of the two light components during recording. Thus, by selecting light in a specific angle range as one light component and selecting light in a predetermined direction as the other light component, when light in the specific angle range is radiated, it is possible to reproduce reflection light or transmission light in the predetermined direction and to provide angle-selective property. Moreover, by making an incidence angle of one light component different from an incidence angle of the other light component, it is possible to provide a refracting property. Further, by making a traveling direction of one light component different from a traveling direction of the other light component (for example, at an azimuth angle), it is possible to provide a deflecting property. Further, a hologram can record multiple holograms of different natures at the same position. For example, a plurality of holograms of which the angle-selective ranges are different may be recorded, and a transmissive hologram and a reflective hologram may be recorded at the same position. Moreover, the intensity of diffracted light is different depending on diffraction efficiency of a hologram.

Moreover, the function of the angle-selective reflector 3 may be realized by a reflecting surface such as, for example, a dielectric multi-layer mirror or a boundary surface (for example, the front surface of glass itself) between media having different refractive indice. A dielectric multi-layer mirror is obtained by alternately stacking a dielectric thin film having a high refractive index and a dielectric thin film having a low refractive index each having a thickness of ¼ of a desired wavelength, and light components reflected from the boundary surfaces between the respective layers are superimposed in an additive manner. Thus, it is possible to realize high reflection efficiency. When light travels from a medium having a large refractive index to a medium having a small refractive index, light having an incidence angle larger than a critical angle experiences total reflection at a boundary surface. Thus, an angle-selective reflector in which the critical angle is used as a threshold angle can function as a boundary surface. However, when light travels from a medium having a small refractive index to a medium having a large refractive index, total reflection does not occur. A front surface of glass itself can be used as a boundary surface. A critical angle of glass determined by the ratio between the refractive index inside glass and the refractive index of air outside the glass is used as the threshold angle. When the incidence angle of light from the inside of glass is larger than the critical angle, total reflection occurs on the surface of the glass, and no light passes through the glass. When the incidence angle is smaller than the critical angle, light passes through the glass. However, since this method confines light in the glass, and light decays in the glass although it depends on the material of glass, it is difficult to propagate light by a long distance and to realize a large light-concentrating mechanism. Thus, the gap between the angle-selective reflector and the angle-increasing reflector is preferably air rather than a medium such as glass.

A hologram is different from a reflecting surface in that a hologram can transmit or reflect light at an angle shifted by a predetermined angle $\alpha$ ($\alpha$ may be zero) from an incidence angle thereof due to a diffraction effect whereas a reflecting surface (including a reflecting mirror, a dielectric multi-layer mirror, and the like) always reflects light at the same angle as the incidence angle to the reflecting surface. The hologram and the reflecting film may be used together.

Specifically, the angle-selective reflector 3 may include a holographic optical element (hereinafter sometimes referred to simply as "HOE"), a dielectric multi-layer film, and an auxiliary reflecting layer (half-mirror) having appropriate transmittance. The HOE, the dielectric multi-layer film, the auxiliary reflecting layer, and the like may be planar and may have a film shape. A photosensitive material may be applied to glass that forms a window structure to form a holographic optical element. A film-shaped HOE is preferable because it is easy to process and can be bonded to a glass window. Moreover, although an appropriate type of dielectric multi-layer film may be used, the dielectric multi-laver film may be deposited to at least one of a front surface and a rear surface of the glass. Further, the HOE, the dielectric multi-layer film, the auxiliary reflecting layer, and the like may be enclosed in glass. In the present specification, although it is described that the window is formed of glass for the sake of convenience, the material of the window is not limited thereto. Beside this, the window may be formed of a resin and may be formed of a material having a property of transmitting light in at least some wavelengths.

The angle-increasing reflector 5 fleets light at an angle larger than an incidence angle thereof in a certain direction (in FIG. 1, a downward direction; hereinafter referred to as an "angle-increasing direction"). The angle-increasing reflector 5 has such an angle-increasing property as to reflect at least a portion of light having passed through the angle-selective reflector 3 at an incidence angle $\theta_1$ smaller than a first threshold angle $\theta_{th}$ at an angle $\theta_2$ larger than the incidence angle $\theta_1$. Due to the angle-increasing property, the incident light is incident to the angle-selective reflector 3 as light having the incidence angle $\theta_1$ larger than the first threshold angle $\theta_{th}$.

The angle-increasing reflector 5 may have at least one of an angle-selective property, a wavelength-selective property, and a deflecting property in addition to the angle-increasing property. When the angle-increasing reflector 5 has an angle-selective property, it is possible to reflect light incident at an angle larger than a predetermined second threshold angle $\varphi_{th}$ (preferably one in the range of 20° and 40°) with respect to the normal N and transmit light incident at an angle smaller than the predetermined second threshold angle $\varphi_{th}$. In this case, since at least a portion of the light from the light source 100 passes toward the rear side of the light-concentrating mechanism, the light-concentrating mechanism can be used as a part of a window through which the outside scene can be seen and lighting can be realized. Moreover, when the angle-increasing reflector 5 has a wavelength-selective property, it is possible to transmit or reflect light in a predetermined wavelength range only and to reflect or transmit light having the other wavelengths. For example, the light-concentrating mechanism can be used as a part of a window by transmitting light in a visible wavelength range and can reflect and concentrate light in the other wavelengths. However, when the light-concentrating mechanism is used as a simple light-concentrating mechanism which does not aim to see the outside scene or realize lighting, the angle-increasing reflector 5 may be formed of a reflecting mirror which does not have an angle-selective property and a wavelength-selective property. Moreover, when angle-increasing reflector 5 has a deflecting property, it is possible to deflect light passing therethrough in a predetermined direction. For example, it is possible to transmit incident light of which the azimuth angle (the east, west, south, and north directions) is oblique by deflecting the azimuth angle in the normal direction and to transmit light having a small incidence angle (for example, light incident vertically) at a large angle to thereby enhance light concentration efficiency.

The function of the angle-increasing reflector 5 can be realized by a reflecting surface (which may have an angle-selective property or may not) and/or a hologram. When a reflecting surface having an inclination angle with respect to the normal, incident light is reflected at an angle shifted by a predetermined angle α (angle-increasing property). Moreover, even when a hologram is used, incident light is reflected at an angle shifted by a predetermined angle α due to a diffraction efficiency (angle-increasing property).

Specifically, the angle-increasing reflector 5 may include a HOE, an inclined dielectric multi-layer film, and an inclined reflecting film, for example. The angle-increasing reflector 5 may be used in combination with an auxiliary reflecting layer having appropriately transmittance. The HOE may be planar and may have a film shape. A photo-sensitive material may be applied to glass that forms a window structure to form a holographic optical element. A film-shaped HOE is preferable because it is easy to process and can be bonded to a glass window. Although an appropriate type of dielectric multi-layer film or reflecting film may be used, the dielectric multi-layer film or reflecting film may be deposited or applied to at least one of a front surface and a rear surface of the glass. Further, the HOE, the dielectric multi-layer film, the auxiliary reflecting layer, and the like may be enclosed in glass.

As described above, the light-concentrating mechanism 20 of the present invention can transmit light incident at an angle $\theta_1$ smaller than a first threshold angle $\theta_{th}$ on a front surface of the angle-selective reflector 3, reflect the light at an angle $\theta_2$ larger than the threshold angle $\theta_{th}$ from the rear surface of the angle-selective reflector 3 with the aid of the angle-increasing reflector 5, and reflect light incident at an angle $\theta_2$ on the rear surface of the angle-selective reflector 3. Thus, it is possible to propagate light taken into the light-concentrating mechanism in a predetermined angle-increasing direction while reflecting the light between the angle-selective reflector 3 and the angle-increasing reflector 5. That is, the light-concentrating mechanism of the present invention can concentrate light incident to the light-receiving surface (the entire front surface of the angle-selective reflector 3) efficiently.

Figure 4:
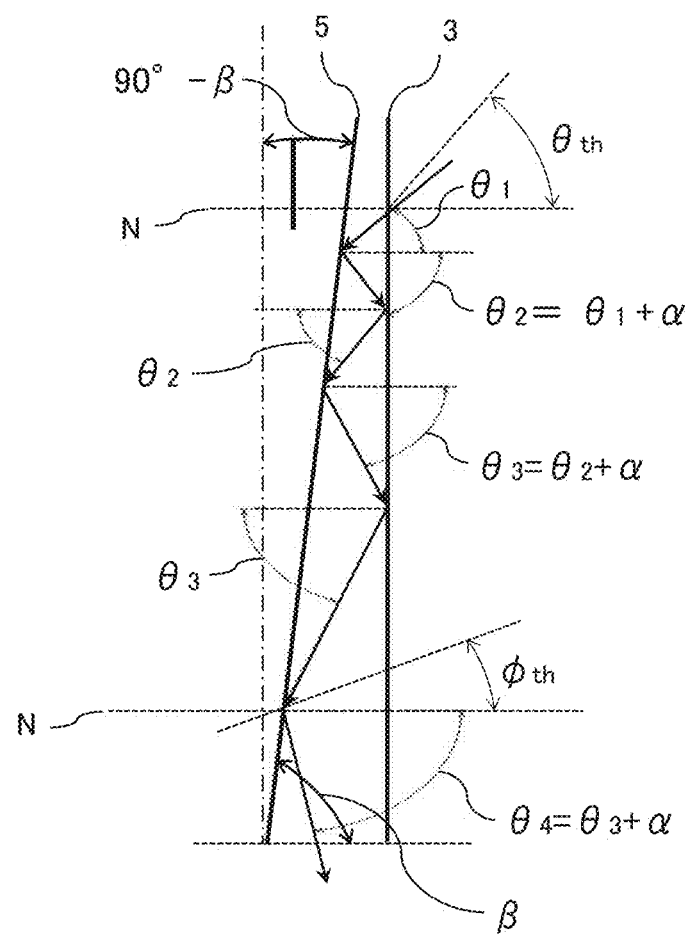
FIG. 4 is a diagram for describing a function of an angle-increasing reflector.

Here, FIG. 4 illustrates a conceptual diagram of the angle-selective reflector 3 and the angle-increasing reflector S in order to briefly explain the functions of the angle-selective reflector 3 and the angle-increasing reflector 5 of the light-concentrating mechanism 20 of the present invention.

The angle-selective reflector 3 can be expressed as a reflecting mirror which has at least an angle-selective property and which reflects light incident at an angle larger than a predetermined first threshold angle $\theta_{th}$ and transmits light incident at an angle smaller than the predetermined threshold angle $\theta_{th}$. The angle-increasing reflector 5 has at least an angle-increasing property and reflects light incident at an angle $\theta_1$ at an angle $\theta_2$ larger than the angle $\theta_1$ by an angle α. The angle-increasing reflector 5 can be expressed as a reflecting mirror having an inclination angle β with respect to the normal N of the angle-selective reflector 3. In this case, the incremental angle α can be expressed as α=(90°−β)×2.

In FIG. 4, in order to allow light having an initial incidence angle $\theta_1$ ($\theta_1 \geq 0$) passing through the angle-selective reflector 3 to be reflected at an angle larger than the first threshold angle $\theta_{th}$ by the angle-increasing reflector 5, it is preferable that the incremental angle α is set in the range of α>$\theta_{th}$−$\theta_1$ with respect to the first threshold angle $\theta_{th}$ of the angle-selective reflector 3 and the initial incidence angle $\theta_1$. That is, the range (90°−β)×2>$\theta^{th}$−$\theta_1$) is preferred. Thus, the upper limit of the inclination angle β of the angle-increasing reflector 5 can be set in the range of β<90°−($\theta_{th}$÷2) assuming that $\theta_1$=0 where ($\theta_{th}$−$\theta_1$) amounts to the maximum. However, as illustrated in FIG. 2, when the angle-selective reflector 3 has a refracting property, the angle-selective reflector 3 may transmit light from the light source at an angle $\theta_2$ larger than the incidence angle $\theta_1$. In this case, the incremental angle α may be set in the range of α>$\theta_{th}$−$\theta_2$.

As described above, the angle-increasing reflector 5 can be formed easily by assuming that it is equivalent to a reflecting mirror which has a predetermined inclination angle β and has an angle-increasing property. In other words, the light-concentrating mechanism 20 can be formed easily by using a reflecting mirror having an angle-selective property and an inclined reflecting mirror and disposing one reflecting mirror so as to be inclined toward the other reflecting mirror at a predetermined inclination angle β.

Thus, when the light-concentrating mechanism 20 is installed in a large space, a plurality of reflecting mirrors may be arranged in an approximately triangular or trapezoidal form in cross-section as illustrated in FIG. 4.

However, when it is necessary to save the space, it may be difficult to arrange reflecting mirrors having an inclination angle β of approximately 85° (corresponding to an incremental angle α of 10° in an approximately triangular form in cross-section. For example, if inclined reflecting mirrors are disposed in the window structure 40 as they are, the thickness of the inclined surface of the successive reflecting mirrors becomes larger than the thickness of the window structure 40 (for example, in the case of general double glazing, the gap between glass panes is 6 mm or 12 mm). Thus, it is difficult to realize a light-concentrating mechanism. Therefore, by dividing a reflecting mirror to dispose the inclined surfaces discontinuously (for example, in a serrated form in cross-section), the angle-increasing reflector 5 may be formed using a reflecting mirror 9 disposed in a thin window structure or glass. The configuration of a reflecting mirror having a serrated cross-section will be described with reference to FIG. 5 to FIGS. 7A to 7C.

[Light Propagation Path]

Next, an optical path along which light from the light source 100 is incident to the light-concentrating mechanism 20 and received by the photovoltaic cell 10 will be described with reference to FIG. 1 or FIG. 4. Although an alignment and an azimuth angle of light from the light source 100 change from time to time within one day, in this example, for the sake of simplicity, it is assumed that the light from the light source 100 is radiated with an elevation angle $\theta_1$ on a plane (hereinafter referred to as a reference plane) that includes the normal N to the light-concentrating mechanism 20 and is vertical to the ground surface.

Moreover, it is assumed that incidence of light to the angle-selective reflector 3 and the angle-increasing reflector 5 or reflection of light therefrom occurs within the reference plane for the sake of simplicity. However, the radiation pattern of light from the light source 100 and the incidence and reflection pattern of light in the angle-selective reflector 3 and the angle-increasing reflector 5 are not limited thereto. Practically, light from the light source 100 propagate in all directions including the components reflected from the surroundings. Moreover, the directions of incidence and reflection in the angle-selective reflector 3 and the angle-increasing reflector 5 may not be in the same plane. The relation of the incidence and reflection may be defined according to an arrangement of the window structure 40 (the direction in relation to the light source 100), the position of the photovoltaic cell 10 in relation to the window structure 40, and the like.

First, when light from the light source 100 is incident to the light-concentrating mechanism 20 at an elevation angle $\theta_1$ smaller than the first threshold angle $\theta_{th}$ from the normal N (a horizontal direction), the incident light passes through the angle-selective reflector 3 and enters the angle-increasing reflector 5 at the angle $\theta_1$. Subsequently, the light incident to the angle-increasing reflector 5 at the angle $\theta_1$ is reflected at an angle $\theta_2$ larger than the angle $\theta_1$ due to the angle-increasing property of the angle-increasing reflector 5 (first reflection).

Subsequently, since the incidence angle $\theta_2$ of the light incident to the angle-selective selective reflector 3 at the angle $\theta_2$ is larger than the first threshold angle $\theta_{th}$ of the angle-selective reflector 3, the light is reflected at an angle $\theta_2$ by the angle-selective reflector 3 (second reflection). When the angle-selective reflector 3 has an angle-increasing property, the reflection angle in the second reflection becomes larger than the incidence angle $\theta_2$. Moreover, the light incident to the angle-increasing reflector 5 at the angle $\theta_2$ is reflected at an angle $\theta_3$ larger than the angle $\theta_2$ due to the angle-increasing property of the angle-increasing reflector 5 (third reflection).

In this manner, light propogates in a predetermined direction between the angle-selective reflector 3 and the angle-increasing reflector 5 while repeating reflections and increasing the reflection angle and finally enters the photovoltaic cell 10.

In the case of FIG. 1 or FIG. 4, the incremental angle α is the difference between the angles $\theta_2$ and $\theta_4$, the difference between the angles $\theta_3$ and $\theta_2$, or the difference between the angles $\theta_4$ and $\theta_3$. The incremental angle α may be always a constant angle (for example, 10°) and may be set to a different angle (for example, 5°, 10°, 15°, or the like) depending on the first incidence angle $\theta_1$, the wavelength of light, or the azimuth angle of light. The incremental angle can be changed using a hologram.

Moreover, when the angle-increasing reflector 5 has an angle-selective property, light incident at an angle larger than a predetermined second threshold angle $\varphi_{th}$ is reflected from the angle-increasing reflector 5 and light incident at an angle smaller than the threshold angle passes through the angle-increasing reflector 5. That is, light incident at an angle larger than the second threshold angle $\varphi_{th}$ of the angle-increasing reflector 5 is used for power generation, and light incident at an angle smaller than the second threshold angle $\varphi_{th}$ is allowed to pass toward the interior side. Thus, at least a portion of the light from the light source can propagate toward the interior side and the visibility of outside scenes and the lighting can be secure. The second threshold angle $\varphi_{th}$ of the angle-increasing reflector 5 may be set appropriately according to the amount of light reaching the interior side, the visibility of outside scenes, and an environment in which the window structure is disposed.

The angle-selective reflector 3 or the angle-increasing reflector 5 may use all wavelength bands of the light from the light source 100 and may have a wavelength-selective property so as to selectively use light in a wavelength band appropriate for power generation according to the performance and type of photovoltaic cells. For example, when a general photovoltaic battery formed of an amorphous silicon is used, wavelengths in the range of approximately 400 and 700 nm may be selected. Moreover, the wavelength band may be selected according to a desired interior environment so that light in an ultraviolet region or an infrared region is blocked. A wavelength range selected by the angle-selective reflector 3 and the angle-increasing reflector 5 may be set appropriately according to the type and amount of light reaching the interior side, the visibility of outside scenes, and an environment in which the window structure is disposed.

The HOE used in the angle-selective reflector 3 or the angle-increasing reflector 5 can be formed by exposure on a hologram recording medium by interference between object light from an incidence direction and reference light from an exiting direction. In this case, a wavelength-selective property can be provided to the HOE by selecting the wavelength of a laser used for exposure. Moreover, rather than causing interference between object light and reference light as parallel light, by causing interference among convergent light, divergent light, and parallel light while controlling the wavefront thereof, it is possible to realize an angle-increasing property even when the incidence direction changes.

The photovoltaic cell 10 is disposed in a predetermined angle-increasing direction (in FIG. 1, the lower side) of the light-concentrating mechanism 20 or disposed at a position to which the light concentrated in the angle-increasing direction propagates. The photovoltaic cell 10 receives the light propagating between the angle-selective reflector 3 and the angle-increasing reflector 5 and converts the received solar energy to electricity. Examples of the photovoltaic cell 10 include a photovoltaic cell formed of a thin silicon film (crystalline silicon, polycrystalline silicon, microcrystalline silicon, and the like), a photovoltaic cell formed of inorganic compounds such as Group III-V compounds, CdTe-based compounds, or CIGS-based compounds, a photovoltaic cell formed of organic compounds such as a conductive polymer or fullerene, and a dye-sensitized photovoltaic cell. The photovoltaic cell 10 may be made up of only one cell and may use a plurality of connected cells.

The photovoltaic cell 10 is provided in at least a portion around the angle-selective reflector 3 and the angle-increasing reflector 5 so that light from the gap between the angle-selective reflector 3 and the angle-increasing reflector 5 can enter a photoelectric conversion layer. Although the photovoltaic cell 10 is preferably disposed on a lower side of the light-concentrating mechanism, the present invention is not limited thereto. The photovoltaic cell 10 may be disposed on the left and right sides or the upper side of the light-concentrating mechanism 20 depending on a positional relation between the light source 100 and the light-concentrating mechanism 20. The photovoltaic cell 10 may be disposed inside or outside the light-concentrating mechanism 20 so as to make contact with the gap between the angle-selective reflector 3 and the angle-increasing reflector 5. Further, the photovoltaic cell 10 may be disposed at a distance from the gap between the angle-selective reflector 3 and the angle-increasing reflector 5. In this case, by providing light-guiding means (a light-guiding plate, an optical fiber, or the like) for propagating light from the gap between the angle-selective reflector 3 and the angle-increasing reflector 5 to the photovoltaic cell 10, the position of the photovoltaic cell is not limited to the position near the light-concentrating mechanism but can be designed freely.

As described above, according to the light-concentrating mechanism, since light can be guided to the photovoltaic cell 10 while increasing the reflection angle of light between the angle-selective reflector 3 and the angle-increasing reflector 5, it is possible to concentrate and utilize the energy of sunlight without waste and to perform power generation efficiently.

For photovoltaic power generation, the light-concentrating mechanisms can be disposed continuously on the ground surface, a wall surface or a rooftop of a facility, and a soundproof wall of a highway, a railroad, and the like in an approximately parallel flat plate form or a triangular form in cross-section. Moreover, the light-concentrating mechanism may be combined with a solar tracking device so that the sunlight vertically enters the light-receiving surface of the light-concentrating mechanism.

Moreover, in the light-concentrating mechanism, the angle-selective reflector 3 and the angle-increasing reflector 5 may be disposed on both surfaces of one glass window of a window structure. Specifically, a film-shaped angle-selective reflector 3 may be provided on a front surface of a glass window, a film-shaped angle-increasing reflector 5 may be provided on a rear surface of the glass window, and the photovoltaic cell 10 may be provided at an end of the glass window. The light incident to the glass window passes through the angle-selective reflector 3 and propagates through a glass medium between the angle-selective reflector 3 and the angle-increasing reflector 5 to reach the photovoltaic cell 10. Further, as described above, the angle-selective reflector 3 may be formed as the glass surface itself. Since a glass surface has a kind of angle-selective property, the glass surface reflects light from a light source incident at an angle larger than a predetermined threshold angle and transmits light incident at an angle smaller than the predetermined threshold angle. Moreover, when the refractive index of a glass medium is set appropriately, and for example, light from a light source is incident to the glass window at a low elevation angle, it is possible to refract the incident light at an angle within a predetermined angle-selective range so as to enter the angle-increasing reflector. That is, it is possible to provide the glass surface with a refracting property.

Further, the light-concentrating mechanism may have the angle-selective reflector 3 and the angle-increasing reflector 5 disposed inside a double-pane window (double glazing) (in the gap between glass panes). Since light from the light source propagate through air in the gap of the double-pane window, a propagation loss is smaller than when light propagates through a glass medium of one piece of glass and light can be concentrated with high efficiency. Further, an environmental condition in the gap of the double-pane window is stable and rarely deteriorates, and the light-concentrating mechanism can be prevented from being broken by external physical force.

Further, the light-concentrating mechanism can be applied to a triple-pane window. Hereinafter, embodiments in which the light-concentrating mechanism of the present invention is applied to a double-pane window and a triple-pane window will be described.

First Embodiment

FIG. 2 is a diagram illustrating a schematic configuration of a double-pane window structure having a light-concentrating mechanism according to a first embodiment. In FIG. 2, a window structure 40A is disposed approximately vertically to a wall surface of an architecture such as a house or a building. For the sake of description, the side close to the light source 100 will be referred to as an exterior side and the opposite side will be referred to as an interior side. Moreover, vertically upward and downward sides of the window structure when seen from the exterior side are referred to as upper and lower sides, and horizontally right and left sides thereof will be referred to as left and right sides. The window structure 40A of the present embodiment includes a window frame 22, an exterior-side glass window 24, and an interior-side glass window 26. The light-concentrating mechanism 20 is included in the gap between the glass windows 24 and 26. The window structure 40A may include the photovoltaic cell 10 at an appropriate position at which light guided by the light-concentrating mechanism 20 can be received (for example, at a position in contact with the gap between the angle-selective reflector 3 and the angle-increasing reflector 5). In the window structure 40A, the glass window 24, the angle-selective reflector 3 (32, 34), the angle-increasing reflector 5 (52, 54), and the glass window 26 are disposed in that order from the exterior side.

In the present specification, although it is described that the window is formed of glass for the sake of convenience, the material of the window is not limited thereto. Beside this, the window may be formed of a resin and may be formed of a material having a property of transmitting light in at least some wavelengths.

The photovoltaic cell 10 is preferably disposed on a lower side inside the window structure 40. However, the position of the photovoltaic cell 10 is not limited thereto, but the photovoltaic cell 10 may be disposed on both left and right sides or the upper side instead of or in addition to the lower side and may be disposed outside (for example, the side close to the architecture) of the window structure 40A. The photovoltaic cell 10 may be disposed at an appropriate position at which light guided by the angle-selective reflector 3 and the angle-increasing reflector 5 can be received.

Moreover, the window structure 40A may preferably include power output means for extracting electricity generated by the photovoltaic cell 10. A power connector 12 may be provided as the power output means and wireless power output means may be provided. The power connector 12 outputs power generated by the photovoltaic cell 10 through photoelectric conversion. The power connector 12 may be connected to a power connector which has a male connector at one end of the left and right ends of the window structure and a female connector at the other end and which is provided in another window structure disposed adjacent to the window structure. Further, the power connector 12 is preferably connected to an external device (for example, a power controller, a power storage, or a device of a power supply destination) via a cable or the like. A power controller (not illustrated) may have a DC/AC conversion function and may supply AC power to the interior and sell electric power.

Moreover, a heat radiating member 28 is preferably provided in contact with the photovoltaic cell 10 in order to suppress the influence of an increase in the temperature of the photovoltaic cell 10. For example, an aluminum frame or the like of a window structure may be used as the heat radiating member 28, and a separate heat radiating member 28 formed of a material having a high heat conductivity may be provided in contact with the photovoltaic cell 10.

Moreover, reflecting mirrors 21 are preferably provided on the upper and the left and right sides inside the window structure 40A. The reflecting mirror 21 may be formed by appropriately combining a resin, glass, aluminum, and stainless steel of which the surfaces are mirror-polished. Moreover, the inner surface of the frame of the window structure 40A may be mirror-polished to form the reflecting mirror. When the reflecting mirrors are used, since light guided to the light-concentrating mechanism 20 will not leak outside from the upper side or the left and right sides, it is possible to concentrate the sunlight efficiently. Further, a moisture absorber (not illustrated) may be disposed inside the window structure 40A. By doing so, since the humidity in the inner space of the closed window structure rarely changes, the performance of the photovoltaic cell 10 may not deteriorate with aging.

The angle-selective reflector 3 is formed of a HOE 34 and may include an auxiliary reflecting layer 32. The HOE 34 has an angle-selective property and a refracting property, transmits light from the light, source 100 incident at an angle $\theta_1$ (for example, 45°) smaller than a predetermined first threshold angle $\theta_{th}$ (for example, 70°) by diffracting the light at an angle $\theta_2$ (for example, 70°) larger than the angle $\theta_1$, and reflects light incident at an angle equal to or larger than the first threshold angle $\theta_{th}$. The HOE 34 preferably has a film form and is applied to or bonded to a rear surface of the glass window 24.

The HOE 34 is preferably formed of a volume hologram to which an angle-increasing property, a wavelength-selective property, and the like can be provided in addition to an angle-selective property and a refracting property and which can record a plurality of holograms. Moreover, when the HOE 31 has a wavelength-selective property, a wavelength is set so as to transmit at least light having a specific wavelength appropriate for power generation of the photovoltaic cell 10. The auxiliary reflecting layer 32 transmits a portion of the light from the light source 100 and reflects light from the interior side. The angle of light incident to the HOE 34 after passing through the reflecting mirror on the upper side or the left and right side in the light-concentrating mechanism 20 may become smaller than the first threshold angle $\theta_{th}$. In this case, although the incident light passes through the HOE 34, the light is reflected again by the auxiliary reflecting layer 32 and experiences multiple reflections inside the light-concentrating mechanism 20. Thus, by providing the auxiliary reflecting layer 32, it is possible to improve light concentration efficiency. A dielectric multilayer mirror, a half-mirror, a HOE, and the like, for example, can be used as the auxiliary reflecting layer 32. The auxiliary reflecting layer 32 preferably has a film form and is applied to or bonded to the rear surface of the glass window 21.

The angle-increasing reflector 5 may be formed of a reflective HOE 52 and may include an auxiliary reflecting layer 54. The reflective HOE 52 reflects incident at an angle $\theta_1$ (for example, 70°) by diffracting the light at an angle $\theta_2$ (for example, 80°) larger than the angle $\theta_1$ due to its angle-increasing property. Moreover, the reflective HOE 52 may have an angle-selective property to transmit light incident at an angle smaller than a predetermined second threshold angle $\varphi_{th}$ (for example, 30°). The reflective HOE 52 preferably has a film form and is bonded to a glass window or the like.

Moreover, the reflective HOE 52 is preferably a volume hologram in order to obtain an angle-increasing property and an angle-selective property. Further, the reflective HOE 52 may have a wavelength-selective property to reflect at least a portion of light having a specific wavelength appropriate for power generation of the photovoltaic cell 10. Moreover, the reflective HOE 52 may have a deflecting property to reflect incident light while deflecting the light in an angle-increasing direction.

The auxiliary reflecting layer 54 reflects at least a portion of the light having passed through the reflective HOE 52 toward the angle-selective reflector 3. A dielectric multilayer mirror, a half-mirror, or the like, for example, can be used as the auxiliary reflecting layer 54. The reflectance (transmittance) of the auxiliary reflecting layer 54 may be set appropriately according to the place and direction in which the window is installed, the brightness required for the interior, the need to view the outside scenes, and the like.

Hereinafter, an optical path along which light from the light source 100 is incident to the window structure 40 (the light-concentrating mechanism 20) and is received by the photovoltaic cell 10 in FIG. 2 will be described.

First, light having an elevation angle $\theta_1$ (for example, 45°) from the light source 100 passes through the auxiliary reflecting layer 32. Subsequently, the light incident to the HOE 34 passes through the HOE 34 since the incidence angle thereof is smaller than the first threshold angle $\theta_1$ (for example, 70°). In this case, the light is diffracted at an angle $\theta_2$ (for example, 70°) larger than $\theta_1$ due to the refracting property of the HOE 34. The light incident to the reflective HOE 52 at the angle $\theta_2$ is reflected by being diffracted at an angle $\theta_3$ (for example, 80°) larger than the angle $\theta_2$ by an incremental angle $\alpha$ (for example, 10°) due to the angle-increasing property of the reflective HOE 52.

When the reflective HOE 52 has an angle-selective property, the light incident at an angle smaller than the second threshold angle $\varphi_{th}$ of the reflective HOE 52 may pass therethrough without being diffracted by the reflective HOE 52. In this case, at least a portion of the transmitted light may be reflected by the auxiliary reflecting layer 54 and may be guided again to the space between the angle-selective reflector 3 and the angle-increasing reflector 5.

After that, the light incident to the HOE, 34 at the angle $\theta_3$ is reflected by the HOE 34 at the angle $\theta_3$ since the incidence angle $\theta_3$ is larger than the first threshold angle $\theta_{th}$ of the HOE 34. When light incident to the HOE 34 at an angle smaller than the threshold angle $\theta_{th}$ of the HOE 34 is present, the incident light may pass through the HOE 34. In this case, at least a portion of the transmitted light may be reflected by the auxiliary reflecting layer 32 and the reflected light may pass through the HOE 34 again to be guided to the space between the angle-selective reflector 3 and the angle-increasing reflector 5.

In this manner, the light incident to the window structure 40A (the light-concentrating mechanism 20) propagates while experiencing multiple reflections between the angle-increasing reflector 5 and the angle-selective reflector 3. Since the reflection angle increases by the incremental angle α at least in the reflective HOE 52, the reflection angle $\theta_n$ may finally reach close to 90° and light may propagate approximately vertically downward to be received by the photovoltaic cell 10.

Although only reflections within the reference plane are described in FIG. 2 for the sake of simplicity, practically, the sunlight propagates in all directions including the components reflected from the surroundings. Light incident from an azimuth angle (the east, west, south, and north directions) oblique to the plane of a window structure can be regarded similarly to the propagation within the reference plane when seen on a plane including the normal N to the incident light. Thus, light incident from an oblique angle propagates while experiencing multiple reflections depending on the incidence direction. In the present embodiment, the reflecting mirror 21 is provided on the upper side and the left and right sides in the window structure. The light having reached the upper side or the left and right sides is guided toward the space between the angle-selective reflector 3 and the angle-increasing reflector 5 by the reflecting mirror 21 redirecting the light in an appropriate direction. Finally, a greater part of the light components are directed to the photovoltaic cell 10.

Further, the HOE 34 can be provided with a deflecting property by forming multiple holograms and can transmit incident light, having an oblique azimuth angle while changing the azimuth angle. The reflective HOE 52 can be provided with a deflecting property by forming multiple holograms and can reflect light while changing the azimuth angle thereof to an appropriate direction. Such a hologram can be formed by causing interference between object light having an oblique azimuth angle and reference light having an azimuth angle different from that of the object light. By doing so, light propagating inside the light-concentrating mechanism can be concentrated on the photovoltaic cell more efficiently.

In the present embodiment, although a holographic optical element is used as the angle-selective reflector 3 and the angle-increasing reflector 5, the material thereof is not limited thereto. For example, one of the angle-selective reflector 3 and the angle-increasing reflector 5 may be formed of a holographic optical element and the other may be formed of a dielectric multi-layer film. In the present embodiment, although the angle-selective reflector 3 and the angle-increasing reflector 5 are bonded to a glass window, at least one of the angle-selective reflector 3 and the angle-increasing reflector 5 may be integrated with the glass window (enclosed in the glass window) similarly to an embodiment described later with reference to FIG. 6.

As described above, according to the window structure of the present embodiment, light from the light source 100 propagates while being reflected in the gap (between the angle-selective reflector 3 and the angle-increasing reflector 5) of the light-concentrating mechanism provided in the double-pane window structure and is received by the photovoltaic cell 10. Thus, it is possible to concentrate and utilize the solar energy without waste and to generate electric power efficiently. Moreover, since the angle-selective reflector, the angle-increasing reflector, and the photovoltaic cell are disposed in the gap of the double-pane window, the window structure is rarely influenced by a change in the surrounding environment. Moreover, the window structure is rarely broken by a physical impact or the like. Further, since a plurality of inexpensive small photovoltaic cells can be disposed in parallel, it is possible to reduce the cost.

In the embodiment, although the photovoltaic power generation device is applied to a double-pane window structure, a triple-pane window structure which aims to strengthen the security function has become popular recently.

Figure 3:
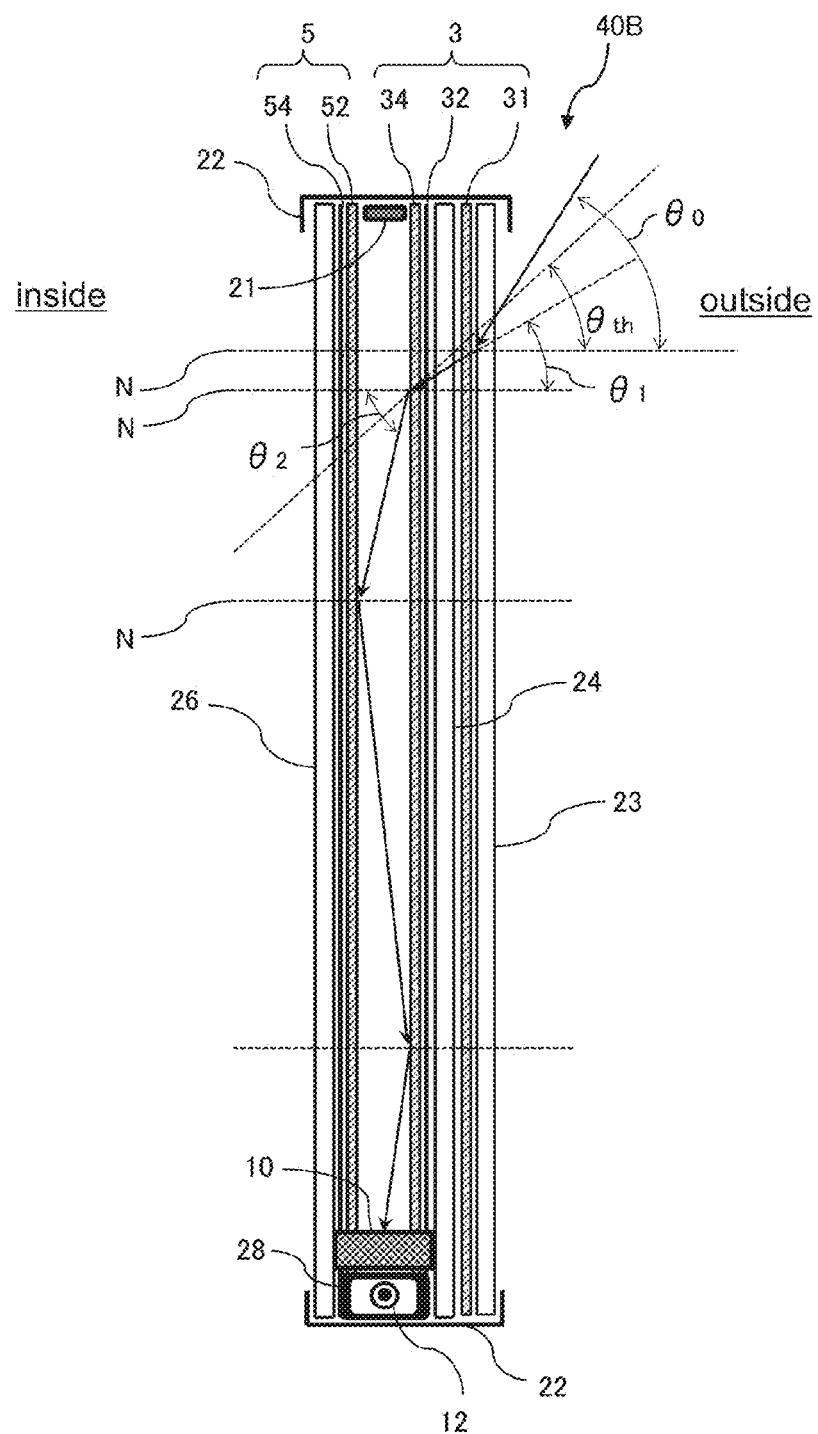
FIG. 3 is a diagram illustrating a schematic configuration of a triple-pane window structure according to the first embodiment.

FIG. 3 is a diagram illustrating a schematic configuration of a triple-pane window structure having a light-concentrating mechanism according to the first embodiment. The window structure 40B of this example is different from the window structure 40A of FIG. 2 in that the glass window 23 is provided on the exterior side of the glass window 24, and an angle-selective correction transmissive HOE 31 is provided between the glass windows 23 and 24. The other configurational elements are the same as those of FIG. 2, and detailed description thereof will not be provided. This example is preferably used when light incident at an angle larger than a predetermined first threshold angle $\theta_{th}$ set in the HOE 34 is further utilized for power generation. For example, when the window structure illustrated in FIG. 2 of which the first threshold angle $\theta_{th}$ is set to 70° is manufactured, the sunlight in low-latitude areas or having a high elevation angle (80°) in the summer could not be utilized since the elevation angle is larger than the threshold angle $\theta_{th}$. However, according to the angle-selective correction transmissive HOE 31 of this example, the sunlight of which the elevation angle is larger than the predetermined first threshold angle $\theta_{th}$ can be also utilized.

The correction transmissive HOE 31 disposed on the exterior side preferably has a film form and is applied or bonded to a rear surface of the glass window 23 closest to the exterior side. The correction transmissive HOE 31 has a refracting property to transmit light incident at an angle $\theta_0$ (for example, 80°) larger than the first threshold angle $\theta_{th}$ by diffracting the light at an angle $\theta_1$ (for example, 70°) smaller than the angle $\theta_0$. The propagation path of light having entered the HOE 34 is the same as that illustrated in FIG. 2. Since light incident at an angle smaller than the first threshold angle $\theta_{th}$ of the HOE 34 passes the correction transmissive HOE 31, the propagation path thereof is the same as that illustrated in FIG. 2.

Further, when the window structure illustrated in FIG. 2 of which the threshold angle $\theta_{th}$, is set to 70° is manufactured as described above, the sunlight in high-latitude areas or having a low elevation angle (for example, 30° or smaller) in the winter could not have an incidence angle larger than the first threshold angle $\theta_{th}$, depending on the incremental angle α applied in the first reflection on the angle-increasing reflector 5. In this case, the correction transmissive HOE 31 may transmit light incident at an angle $\theta_0$ (for example, 25°) much smaller than the predetermined first threshold angle $\theta_{th}$ while diffracting the light at an angle $\theta_1$ (example, 50°) close to the predetermined threshold angle $\theta_{th}$ so as to be sufficiently larger than the angle $\theta_0$. The light incident to the HOE 34 at the angle $\theta_1$ (for example, 50°) exits the HOE 34 at a larger angle $\theta_2$ (for example, 60°) due to the refracting property of the HOE 34. Thus, even when the incremental angle $\alpha$ of the reflective HOE 52 is small (for example, 10°), the incidence angle of the light can exceed the predetermined first threshold angle $\theta_{th}$, and the light can be reflected by the HOE 34 and propagate in the gap of the light-concentrating mechanism 20.

As described above, according to the window structure 40B having the light-concentrating mechanism of FIG. 3, due to the correction transmissive HOE 31, it is possible to utilize light incident at an angle larger than the threshold angle $\theta_{th}$ of the HOE 34. Moreover, it is possible to utilize light incident at an angle $\theta_0$ much smaller than the predetermined first threshold angle $\theta_{th}$. According to such a triple-pane window structure, a standard threshold angle $\theta_{th}$ (for example, for middle-latitude areas) is set to the HOE 34, the double-pane window structure 40A based on the pair of glass windows 24 and 26 is used as a basic structure, and the glass window 23 having the correction transmissive HOE 31 on the exterior side can be replaceable according to an area and a season. In this way, the window structure 40B for high or low-latitude areas can be formed using the basic designs of a light-concentrating mechanism applied to the window structure 40A illustrated in FIG. 2.

Second Embodiment

In the above embodiment, a holographic optical element is used as the angle selective reflector 3 and the angle-increasing reflector 5 of the light-concentrating mechanism, and the holographic optical element is disposed in the gap of a double-pane glass window. The angle-selective reflector 3 and the angle-increasing reflector 5 of the light-concentrating mechanism may be also formed of a reflecting mirror (dielectric multi-layer mirror) and the reflecting mirror may be enclosed in a glass window. By doing so, it is possible to form a window structure having a light concentrating function.

Figure 5:
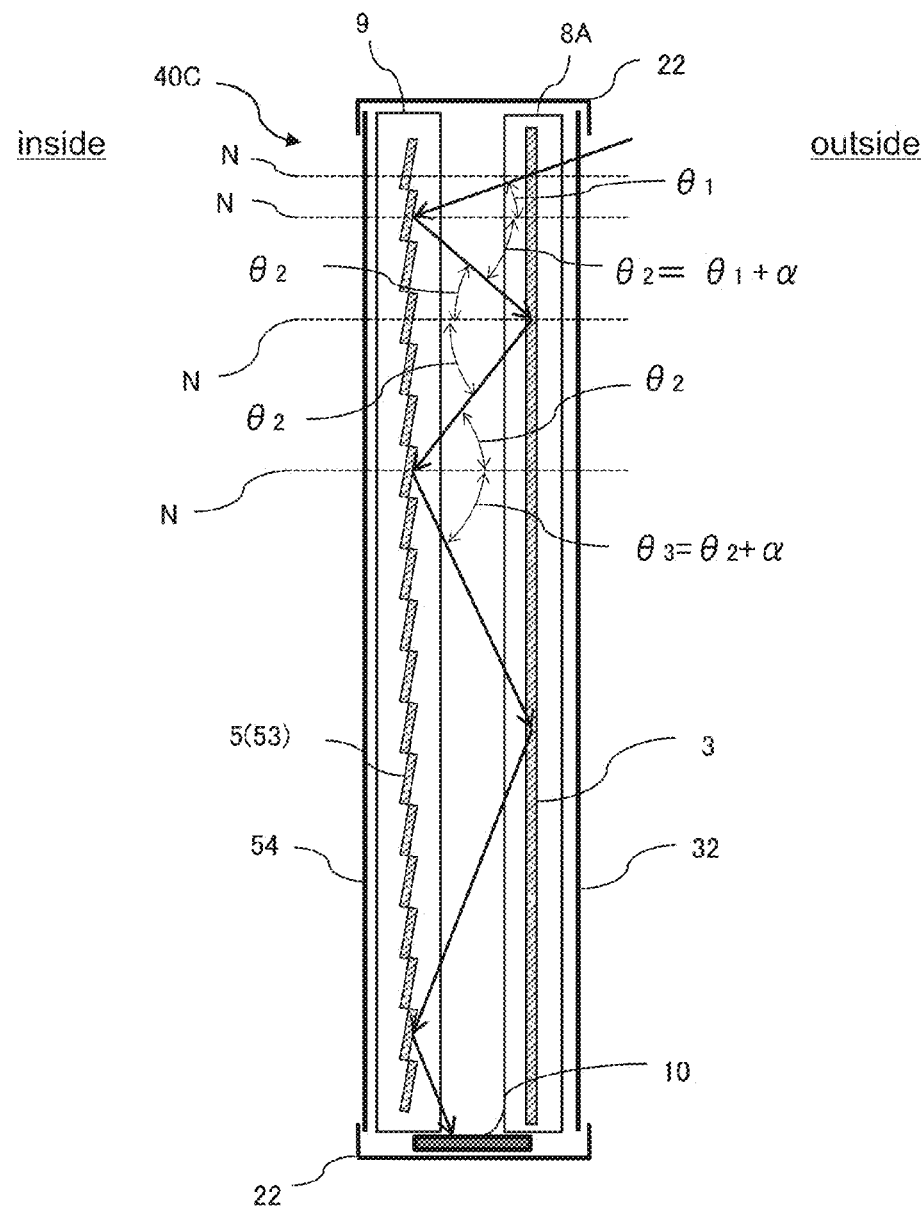
FIG. 5 is a diagram illustrating a schematic configuration of a window structure according to a second embodiment and a glass window used therein.

FIG. 5 is a diagram illustrating a schematic configuration of a window structure according to the second embodiment and a glass window used therein. A window structure 40C includes a window frame 22, a first functional glass window 8A on the exterior side, and a second functional glass window 9 on an interior side.

The first functional glass window 8A includes an angle-selective reflector 3 which has at least an angle-selective property and which is disposed in the glass. The angle-selective reflector 3 is formed of a holographic optical element or a reflecting mirror using a flat dielectric multi-layer film. The configuration of the first functional glass window 8A illustrated in FIG. 5 is a simple example and is not limited to this. Using the critical angle of glass itself, the glass surface itself may be used as the angle-selective reflector 3 that reflects light incident at an angle equal to or larger than a predetermined threshold angle. Moreover, the angle-selective reflector 3 formed of a dielectric multi-layer film or the like may be provided on the glass surface rather than providing the same in the glass.

The second functional glass window 9 includes an angle-increasing reflector 5 which includes at least an angle-increasing property and which is included in the glass. The angle-increasing reflector 5 is formed of a reflecting mirror of a dielectric multi-layer film 53 formed in a serrated form, for example. The reflecting mirror of the dielectric multi-layer film 53 is formed in a serrated form that includes a plurality of inclined surfaces 56 inclined at a constant inclination angle $\beta$ as illustrated in FIGS. 7A to 7C described later. The configuration of the second functional glass window 9 illustrated in FIG. 5 is a simple example and is not limited to this. When it is not necessary to take good visibility of outside scenes into consideration, the serrated reflecting mirror of the dielectric multi-layer film 53 may be provided on the glass surface rather than providing the same in the glass.

Although FIG. 5 illustrates a serrated reflecting mirror, the shape of inclined surfaces disposed discontinuously is not limited to a serrated form in cross-section as long as the reflecting mirror includes an inclined surface having a predetermined inclination angle. For example, the reflecting mirror may have a shape in which inclined surfaces are disposed regularly or irregularly (for example, a triangular wave form in which triangular projections appear continuously or a trapezoidal wave form in which inclined surfaces appear regularly).

Moreover, the angle-increasing reflector 5 preferably has an angle-selective property. By doing so, since at least a portion of the light from the light source passes through the second functional glass window 9, it is possible to secure the lighting and the visibility of the outside scenes. The angle-selective reflector 3 can be formed using such a flat holographic optical element that realizes an angle-increasing property instead of the serrated dielectric multi-layer mirror.

In the window structure 40C, the first functional glass window 8A and the second functional glass window 9 form the light-concentrating mechanism 20. The window structure 40C may include a photovoltaic cell 10 at an appropriate position (for example, the lower side of the window structure 40) at which the light guided by the light-concentrating mechanism 20 can be received. Moreover, the window structure 40C may be connected to a photovoltaic cell disposed outside. The window structure 40C may be configured to concentrate light from the light source as light that propagates between the respective functional glass windows.

In the present embodiment, the threshold angle $\theta_{th}$, the incidence angle, the reflection angle, and the like are defined with respect to the normal N to the functional glass window 8 or 9 or the window structure 40 regardless of the serrated inclined surface of the angle-selective reflector 3 or the angle-increasing reflector 5.

Moreover, auxiliary reflecting layers 32 and 54 may be disposed on a front surface of the first functional glass window 8A and a rear surface of the second functional glass window 9, respectively. Although the auxiliary reflecting layer 32 is provided separately from the flat angle-selective reflector 3 in FIG. 5, the auxiliary reflecting layer 32 may be provided in the glass by being bonded to the angle-selective reflector 3. Moreover, although the auxiliary reflecting layer 54 is provided separately from the serrated dielectric multi-layer film 53, the auxiliary reflecting layer 53 may be provided in the glass by being bonded to the inclined surface of the dielectric multi-layer film 53.

The propagation path of light between the first functional glass window 8A and the second functional glass window 9 of the window structure 40C is the same as the propagation path illustrated in FIG. 2, and detailed description thereof will not be provided.

Figure 6:
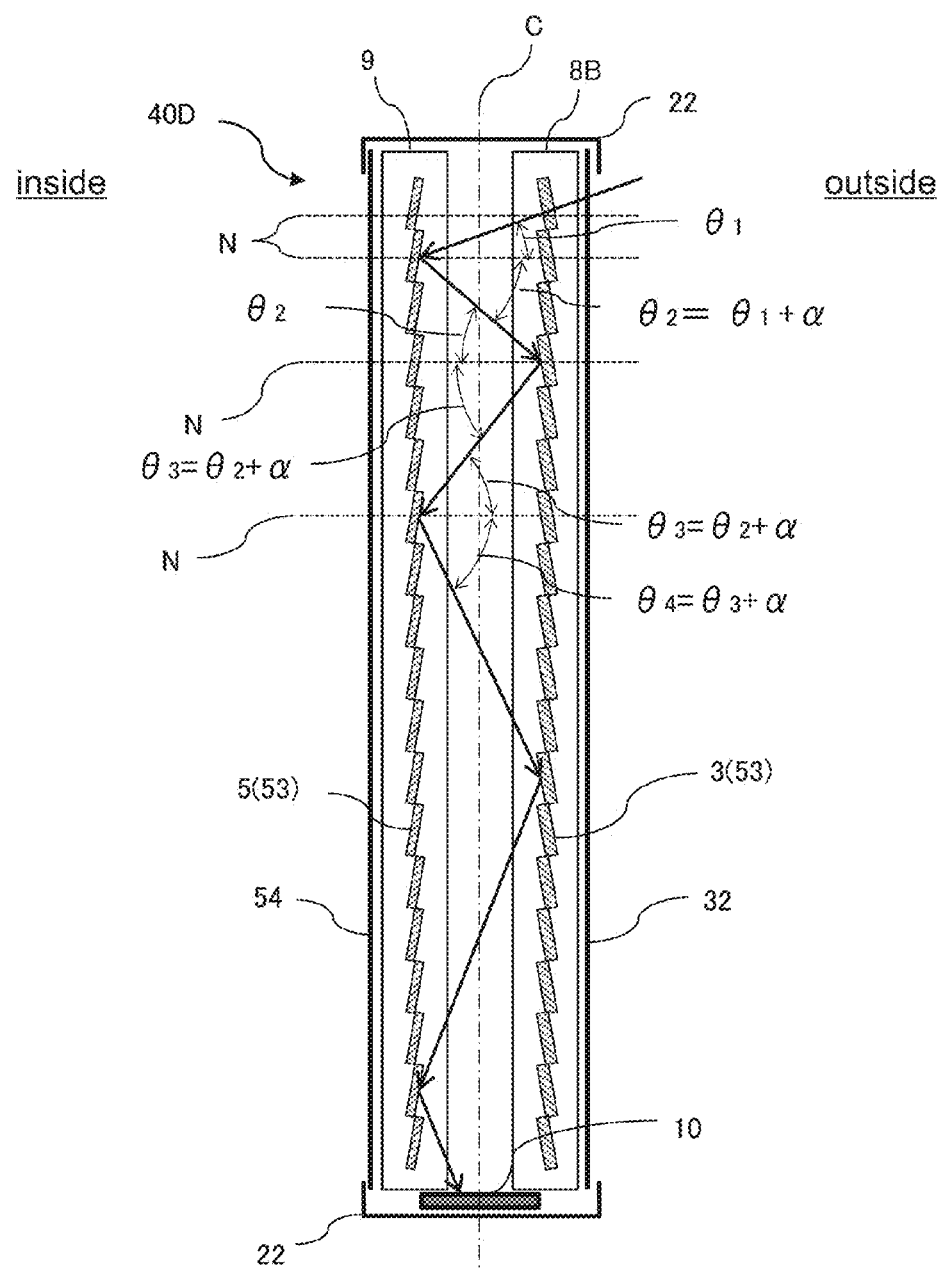
FIG. 6 illustrates another example of the window structure according to the second embodiment.
Figure 7:
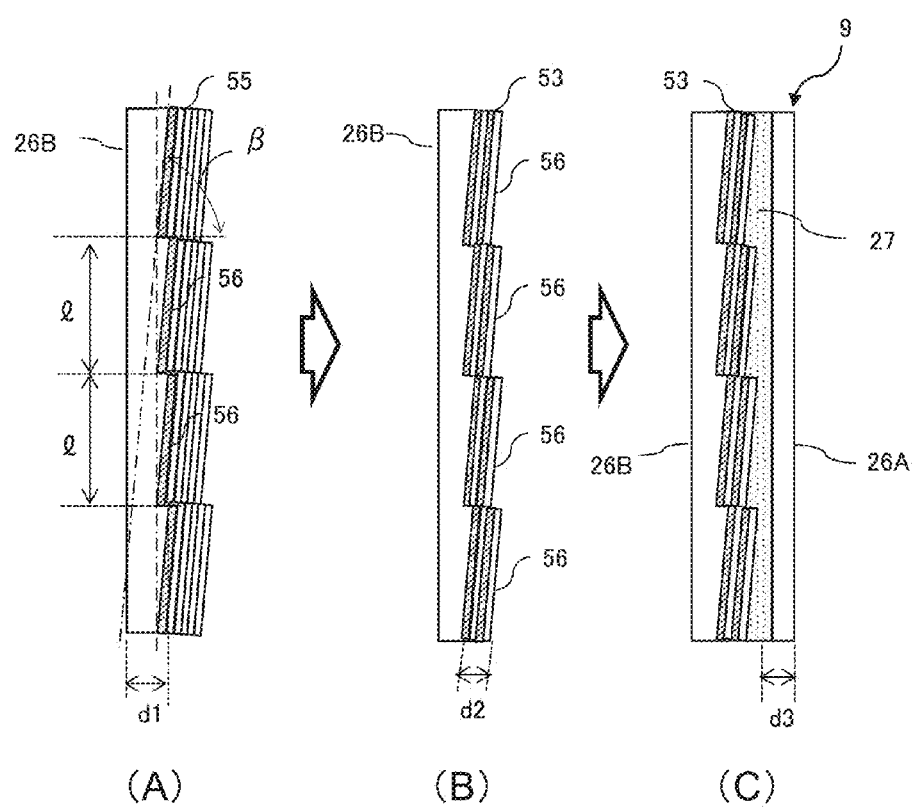
FIGS. 7A to 7C illustrate an example of a method of manufacturing a functional glass window including a serrated dielectric multi-layer film.

FIG. 6 is a diagram illustrating a schematic configuration of another example of a window structure according to the second embodiment. A window structure 40D of FIG. 6 is different from the window structure 40C of FIG. 5 in that a first functional glass window 8B including the angle-selective reflector 3 which uses a serrated dielectric multi-layer film 53 is used instead of the first functional glass window 8A illustrated in FIG. 5. The first functional glass window SB has an angle-increasing property as well as an angle-selective property. The other configurational elements are the same as those illustrated in FIG. 5, and description thereof will not be provided.

The angle-increasing reflector 5 of the second functional glass window 9 illustrated in FIG. 5 has an angle-selective property to transmit light from the exterior side incident at an angle smaller than a predetermined second threshold angle $\varphi_{th}$. Since the angle-increasing reflector 5 in the second functional glass window 9 is inclined at an inclination angle β (incremental angle α=(90°−β)×2), if light is incident at an angle smaller than the angle ($\varphi_{th}$+α) from the interior side, the incident light passes toward the exterior side.

In other words, the second functional glass window 9 is means which has such an angle-selective property as to reflect light incident at an angle larger than a threshold angle ($\theta_{th}$=$\varphi_{th}$+α) and transmit light incident at an angle smaller than the threshold angle ($\theta_{th}$=$\varphi_{th}$+α) when seen from the interior side.

Thus, when the second functional glass window 9 is used just in a reversed manner, the second functional glass window 9 can be used as the first functional glass window 8B including the angle-selective reflector 3. However, when the threshold angle ($\theta_{th}$=$\varphi_{th}$+α) is smaller than the range desirable as the light-concentrating mechanism (for example, when $\varphi_{th}$ is approximately 30°, α is approximately 5°, and the sum is approximately 35°), the first threshold angle $\theta_{th}$ of the angle-selective reflector 3 of the first functional glass window 8B may have a different value (for example, 70°) from the value set by the second threshold $\varphi_{th}$ and the incremental angle α of the angle-increasing reflector 5.

As illustrated in FIG. 6, the angle-selective reflector 3 (the serrated dielectric multi-layer film 53) in the first functional glass window 8B and the angle-increasing reflector 5 (the serrated dielectric multi-layer film 53) in the second functional glass window 9 are bilaterally symmetrical about the central line C between the respective glass windows and are disposed in an inverted V-shape so that the inclined surfaces thereof are inclined inwardly (that is, in a predetermined direction (toward the photovoltaic cell 10)). However, the present invention is not limited to this, the angle-selective reflector 3 and the angle-increasing reflector 5 may be disposed so that the inclined surfaces thereof have different inclination angles (that is, the reflectors are not bilaterally symmetrical).

Since light incident obliquely upward to the first functional glass window 8B from the light source 100 is incident at a small angle with respect to the normal to the inclined surface 56 of the dielectric multi-layer film 53 (the incidence angle is smaller than the first threshold angle $\theta_{th}$ to the normal N of the window structure), the incident light passes through the first functional glass window 8B. The light incident at a first angle $\theta_1$ to the dielectric multi-layer film 53 of the second functional glass window 9 has a large angle with respect to the normal to the inclined surface 56 of the dielectric multi-layer film 53 (since the incident angle is larger than the second threshold angle $\varphi_{th}$ to the normal N of the window structure), the incident light is reflected at an angle $\theta_2$ (=$\theta_1$+α) to which an incremental angle α corresponding to the inclination angle β is added.

Subsequently, light incident at an angle $\theta_2$ to the dielectric multi-layer film 53 of the first functional glass window 8B has a large angle with respect to the normal to the inclined surface 56 of the dielectric multi-layer film 53, the incident light is reflected at an angle $\theta_3$ (=$\theta_2$+α) to which the incremental angle α is further added. In this manner, the light guided between the respective glass windows propagates in a predetermined direction while increasing its angle by the incremental angle α corresponding to the inclination angle β due to the inclination angle β of the dielectric multi-layer film in the first and second functional glass windows 8B and 9 and finally enters the photovoltaic cell 10.

In the present embodiment, although a configuration in which a serrated dielectric multi-layer film is enclosed in a glass window has been described as the angle-selective reflector 3 and the angle-increasing reflector 5, the present invention is not limited to this. At least one of the first functional glass window 8 and the second functional glass window 9 may be formed by enclosing a holographic optical element formed in a shape corresponding to the serrated structure instead of the dielectric multi-layer film. Further, at least one of the first functional glass window S and the second functional glass window 9 may be formed by enclosing a planar holographic optical element as illustrated in FIG. 2 in a glass member of a glass window.

FIGS. 7A to 7C illustrate an example of a method of manufacturing a functional glass window including a serrated dielectric multi-layer film. First, as illustrated in FIG. 7A, an inclined surface having a predetermined shape is formed on one surface of a glass substrate. The serrated structure of a glass substrate 26B is a structure in which right-angled triangles of inclined cross-sectional surfaces having an inclination angle β are continuously disposed in a up-down direction and is formed by repeatedly forming triangular grooves that are narrow in the left-right direction on the surface of the glass substrate 26B. The length l of the inclined surface in the up-down direction is preferably in the range of 1 to 20 mm, and the thickness d1 of the thickest portion is preferably in the range of 1 to 3 mm.

Subsequently, the glass substrate 26B having a serrated structure formed therein is loaded into a deposition apparatus, and a dielectric thin film 55 is formed on the inclined surface of the glass substrate by deposition or sputtering. Moreover, when the dielectric thin film is deposited by repeating deposition or sputtering, a dielectric multi-layer film 53 is formed on the inclined surface of the glass substrate 26B as illustrated in FIG. 7B.

The dielectric multi-layer film 53 is obtained by alternately stacking a dielectric thin film having a high refractive index and a dielectric thin film having a low refractive index each having a thickness of ¼ of a desired wavelength, and light components reflected from the boundary surfaces between the respective layers are superimposed in an additive manner. Thus, it is possible to realize high reflection efficiency. The refractive index, the thickness, the number of layers, and the like of multi-layers may be appropriately set based on the wavelength (for example, 400 to 700 nm) of incident light used for power generation. By doing so, it is possible to control an angle-selective range or a wavelength-selective range of incident light.

The glass substrate in which the dielectric multi-layer film 53 having the serrated inclined surface (having an inclination angle β) illustrated in FIG. 7B has the function of a reflecting mirror disposed at an inclination angle β illustrated in FIG. 4. Although the dielectric multi-layer film 53 in a single-side attached state of FIG. 7B can be used as a reflecting mirror, the dielectric multi-layer film 53 is preferably further enclosed by a glass material or the like in order to protect the dielectric multi-layer film 53 from an external impact or the like.

In FIG. 7C, the inclined surface 56 of the serrated structure of the dielectric multi-layer film 53 is attached to a flat glass 26A by an optical adhesive 27 so that the dielectric multi-layer film 53 is enclosed in the glass. Here, although enclosing preferably involves confining the dielectric multi-layer film (the angle-selective reflector or the angle-increasing reflector) or the like in a glass material completely, the enclosing may include exposing at least a portion (for example, peripheral ends) of the dielectric multi-layer film or the like. The thickness d3 of the flat glass 26A is preferably in the range of 1 to 3 mm, and the entire thickness of the functional glass window 9 having an angle-increasing property is preferably in the range of 3 to 6 mm. In this way, a functional glass window including the dielectric multi-layer film 53 functioning as the angle-increasing reflector 5 is formed.

In the both-side attached state illustrated in FIG. 7C, both surfaces of the functional glass window 9 including the dielectric multi-layer film 53 are flat and the front and rear surfaces are parallel to each other, the optical axis of at light having through at least the functional glass window will not be refracted, and the outside scene seen from the interior side will be rarely distorted.

In FIGS. 7A to 7C, although an example in which a dielectric multi-layer film having a serrated inclined surface is enclosed in the glass has been described as the angle-increasing reflector having an angle-increasing property or an angle-selective reflector to which an angle-increasing property is provided has been described, the functional glass window of the present invention is not limited to this. A hologram sheet may be enclosed in a glass member as the angle-increasing reflector so as to form a serrated inclined surface, and a planar hologram sheet that realizes an angle-increasing property may be enclosed in a glass member. Further, a planar dielectric multi-layer film or a planar hologram sheet may be enclosed in a glass member as angle-selective means.

As described above, according to the present embodiment, it is possible to provide a light-concentrating mechanism to two pieces of glass windows and to form a window structure having a light concentrating function. Moreover, it is possible to manufacture a functional glass window used for a light-concentrating mechanism. In the functional glass window, since the angle-increasing reflector and the angle-selective reflector functioning as the light-concentrating mechanism are enclosed in a glass member, the functional glass window is strong against an external physical impact. Moreover, it is possible to utilize the gap of the double-pane window more effectively than the window structure of the first embodiment and to set the angle-selective property to be large, in the present specification, although a plurality of embodiments have been described, the scope of application of the present invention is not limited to these embodiments. For example, the plurality of embodiments may be combined with each other.

REFERENCE SIGNS LIST

1: Photovoltaic power generation device
3: Angle-selective reflector
5: Angle-increasing reflector
8: First functional glass window
9: Second functional glass window
10: Photovoltaic cell
12: Power connector
20: Light-concentrating mechanism
40: Window structure

The invention claimed is:

1. A light-concentrating mechanism comprising:
an angle-selective reflector configured to reflect light having an incidence angle equal to or larger than a first threshold angle and to transmit at least a portion of light having an incidence angle smaller than the first threshold angle; and
an angle-increasing reflector including a flat holographic optical element configured to reflect incident light at an angle larger than an incidence angle thereof, the reflectors being disposed with a gap therebetween, wherein:
the angle-increasing reflector is configured to reflect at least a portion of the light that passes through the angle-selective reflector at an angle equal to or larger than the first threshold angle,
the angle-selective reflector is configured to reflect light having an angle equal to or larger than the first threshold angle and that is reflected by the angle-increasing reflector, and wherein the angle-selective reflector comprises an angle-increasing property configured to reflect light reflected from the angle-increasing reflector and incident to the angle-selective reflector at an angle larger than the incidence angle thereof, and the angle-increasing reflector comprises an angle-increasing property configured to reflect light from the angle-selective reflector at an angle larger than the incidence angle thereof,
the angle-selective reflector and the angle-increasing reflector are both configured to reflect light at an incrementally increasing angle with each successive reflection by the angle-selective reflective and the angle-increasing reflector, and to propagate and maintain the light within the gap between the angle-selective reflector and the angle-increasing reflector, thereby concentrating the light within the gap.

2. The light-concentrating mechanism according to claim 1, wherein
the angle-selective reflector is configured to refract light passing through the angle-selective reflector at an angle larger than an incidence angle thereof.

3. The light-concentrating mechanism according to claim 1, wherein
the angle-increasing reflector is configured to reflect light incident at an incidence angle equal to or larger than a second threshold angle and transmit light incident at an incidence angle smaller than the second threshold angle.

4. The light-concentrating mechanism according to claim 1, wherein
the angle-selective reflector or the angle-increasing reflector is configured to transmit or reflect light incident to the angle-selective reflector or the angle-increasing reflector while deflecting a traveling direction of the light.

5. The light-concentrating mechanism according to claim 1, wherein
the angle-selective reflector and the angle-increasing reflector are configured to transmit light in a predetermined wavelength range.

6. The light-concentrating mechanism according to claim 1, wherein
the angle-selective reflector is provided on a front surface of glass and the angle-increasing reflector is provided on a rear surface of the glass so that light is concentrated on an end of the glass as the light propagates in the gap between the angle-selective reflector and the angle-increasing reflector.

7. The light-concentrating mechanism according to claim 6, wherein
the front surface of the glass comprises a boundary surface defining the angle selective reflector.

8. The light-concentrating mechanism according to claim 1, wherein
the angle-selective reflector includes a flat holographic optical element or dielectric multi-layer film, and
the flat holographic optical element or dielectric multi-layer film reflects light having an incidence angle equal to or larger than the first threshold angle and transmits light having an incidence angle smaller than the first threshold angle.

9. The light-concentrating mechanism according to claim 1, wherein
the angle-selective reflector includes an inclined surface of a dielectric multi-layer mirror or a reflective holographic optical element,
wherein light from the angle-increasing reflector is reflected at an angle larger than an incidence angle thereof.

10. A photovoltaic power generation device comprising:
the light-concentrating mechanism according to claim 1; and
a photovoltaic cell that receives light concentrated by the light-concentrating mechanism to generate electricity.

11. A window structure having a light-concentrating mechanism, comprising:
two pieces of glass disposed in parallel with a gap therebetween;
an angle-selective reflector provided in one of the two pieces of glass and configured to reflect light having an incidence angle equal to or larger than a predetermined threshold angle and transmit light having an incidence angle smaller than the predetermined threshold angle; and
an angle-increasing reflector provided in the other one of the two pieces of glass and configured to reflect light from the angle-selective reflector at an angle larger than an incidence angle thereof, wherein
the angle-increasing reflector is configured to reflect at least a portion of the light that passes through the angle-selective reflector at an angle equal to or larger than the predetermined threshold angle,
the angle-selective reflector is configured to reflect light having an angle equal to or larger than the predetermined threshold angle and that is reflected by the angle-increasing reflector, and wherein the angle-selective reflector comprises an angle-increasing property configured to reflect light reflected from the angle-increasing reflector and incident to the angle-selective reflector at an angle larger than the incidence angle thereof, and the angle-increasing reflector comprises an angle-increasing property configured to reflect light from the angle-selective reflector at an angle larger than the incidence angle thereof,
the angle-selective reflector and the angle-increasing reflector are both configured to reflect light at an incrementally increasing angle with each successive reflection by the angle-selective reflector and the angle-increasing reflector, and to propagate and maintain the light within the gap between the angle-selective reflector and the angle-increasing reflector, thereby concentrating the light within the gap, and
the angle-increasing reflector is a flat holographic optical element and is bonded to or deposited on a side of the other one of the two pieces of glass close to the gap.

12. The window structure according to claim 11, wherein
the angle-selective reflector is a flat holographic optical element or dielectric multi-layer film and is bonded to or deposited on a side of one of the two pieces of glass close to the gap.

13. The window structure according to claim 11, wherein
the angle-selective reflector includes an inclined surface of a dielectric multi-layer mirror or a reflective holographic optical element,
wherein light from the angle-increasing reflector is reflected at an angle larger than an incidence angle thereof.

14. The window structure according to claim 11, further comprising:
a photovoltaic cell that receives light concentrated in a predetermined direction by the angle-selective reflector and the angle-increasing reflector to generate electricity.

* * * * *